United States Patent [19]

Seta et al.

[11] Patent Number: 5,365,124
[45] Date of Patent: Nov. 15, 1994

[54] BICMOS LOGIC CIRCUIT

[75] Inventors: Katsuhiro Seta, Tokyo; Hiroyuki Hara, Fujisawa, both of Japan

[73] Assignee: Kabushiki Kaisha Toshiba, Kawasaki, Japan

[21] Appl. No.: 95,764

[22] Filed: Jul. 23, 1993

[30] Foreign Application Priority Data

Jul. 27, 1992 [JP] Japan .................................. 4-199527

[51] Int. Cl.$^5$ ............................................ H03K 19/08
[52] U.S. Cl. ........................................ 326/110; 327/433
[58] Field of Search ................ 307/446, 570, 443, 300

[56] References Cited

U.S. PATENT DOCUMENTS

| | | | |
|---|---|---|---|
| 4,890,018 | 12/1989 | Fukushi | 307/446 |
| 5,030,860 | 7/1991 | Tran | 307/446 |
| 5,254,885 | 10/1993 | Ando | 307/446 |

FOREIGN PATENT DOCUMENTS 3-34720 2/1991 Japan .

OTHER PUBLICATIONS

"ISSCC92/Session 3/High-Performance Circuits/Paper WP 3.2", Hiraki et al., IEEE International Solid State Circuits Conference, pp. 48 & 49 (1992).

Primary Examiner—Edward P. Westin
Assistant Examiner—Andrew Sanders
Attorney, Agent, or Firm—Finnegan, Henderson, Farabow, Garrett & Dunner

[57] ABSTRACT

An input terminal IN is connected to the input of a CMOS inverter, and also to the gate of an N-channel MOS transistor N10. The output of the CMOS inverter is coupled to the base of an NPN transistor Q11 used for pulling up the output terminal OUT. The drain of the transistor N10 is connected to the input of a CMOS inverter. The output of the inverter is connected to the base of an NPN transistor Q12 used for pulling down the output terminal OUT. The emitter of the transistor Q11 and the collector of the transistor Q12 are connected to an output terminal OUT, which is coupled to the gate of a P-channel MOS transistor P12 and the gate of an N-channel MOS transistor N3. The drain of the transistor P12 is connected to the drain of the transistor N10. The drain of the transistor N13 is connected to the source of the transistor N10. The transistors N10, P12, and N13 constitute a circuit for controlling the CMOS inverter.

8 Claims, 3 Drawing Sheets

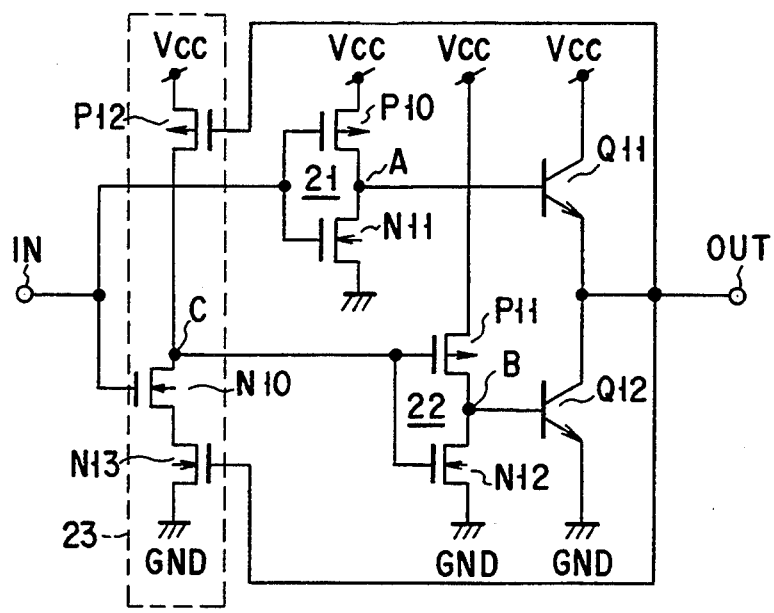
F I G. 2

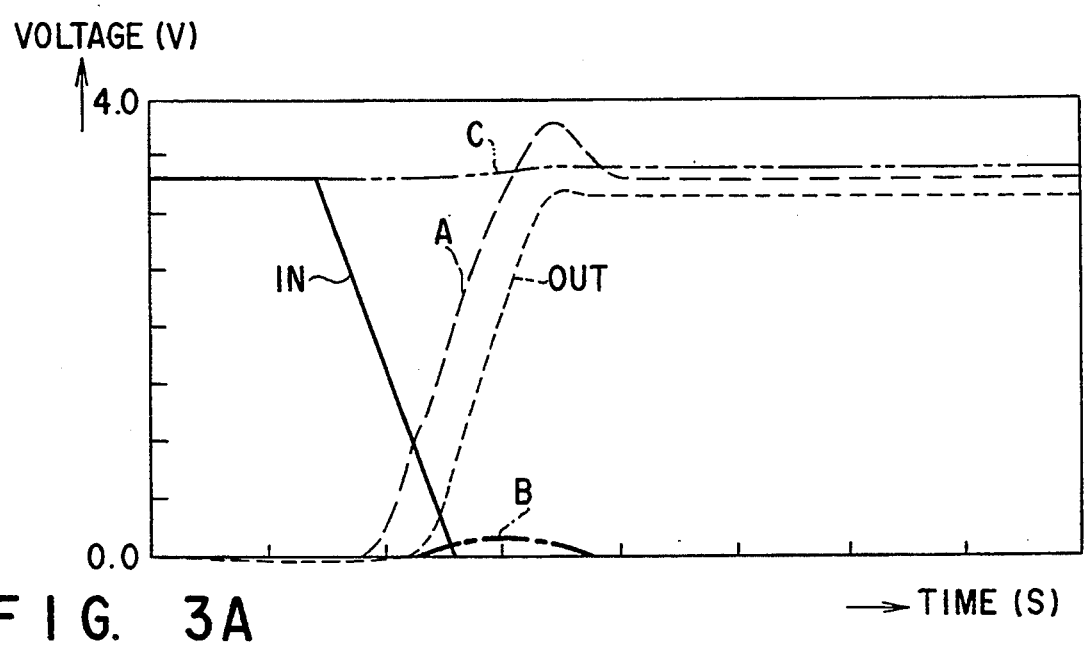
F I G. 3A
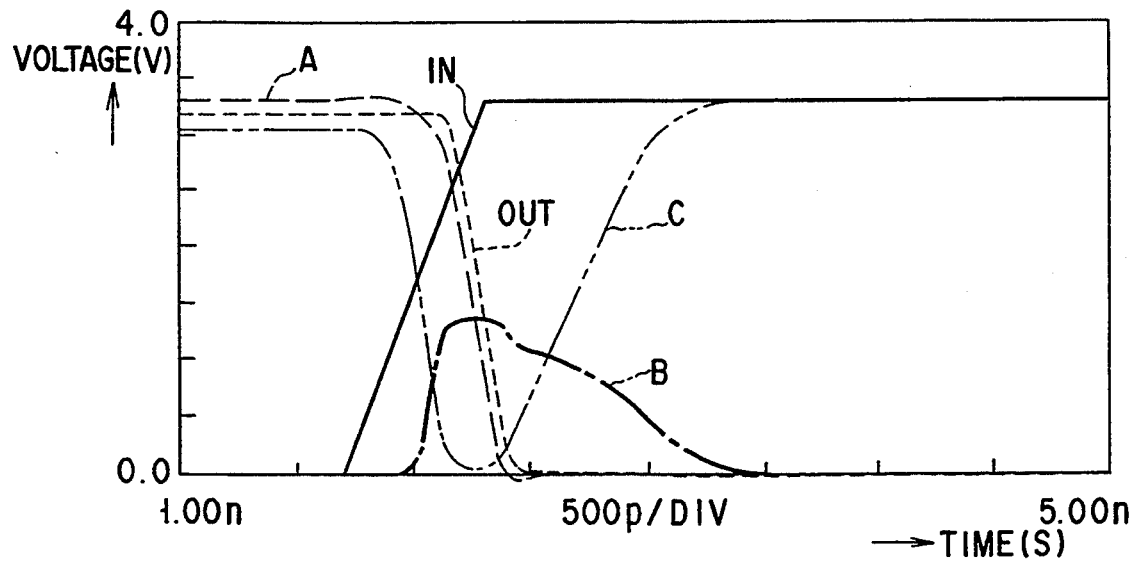
F I G. 3B

OPERATING SPEEDS OF INVERTERS (SPICE Simulation)
POWER SUPPLY VOLTAGE = 3.3V (ps)
| CAPACITANCE OF LOAD | | CMOS | BiCMOS | EMBODIMENT |
|---|---|---|---|---|
| 0.1pF | TpLH | 323 | 303 | 337 |
| | TpHL | 120 | 246 | 192 |
| | Tpd | 222 | 275 | 263 |
| 0.5pF | TpLH | 793 | 401 | 429 |
| | TpHL | 330 | 377 | 270 |
| | Tpd | 562 | 389 | 349 |
| 1.0pF | TpLH | 1392 | 508 | 533 |
| | TpHL | 544 | 490 | 344 |
| | Tpd | 968 | 499 | 439 |
F I G.  4
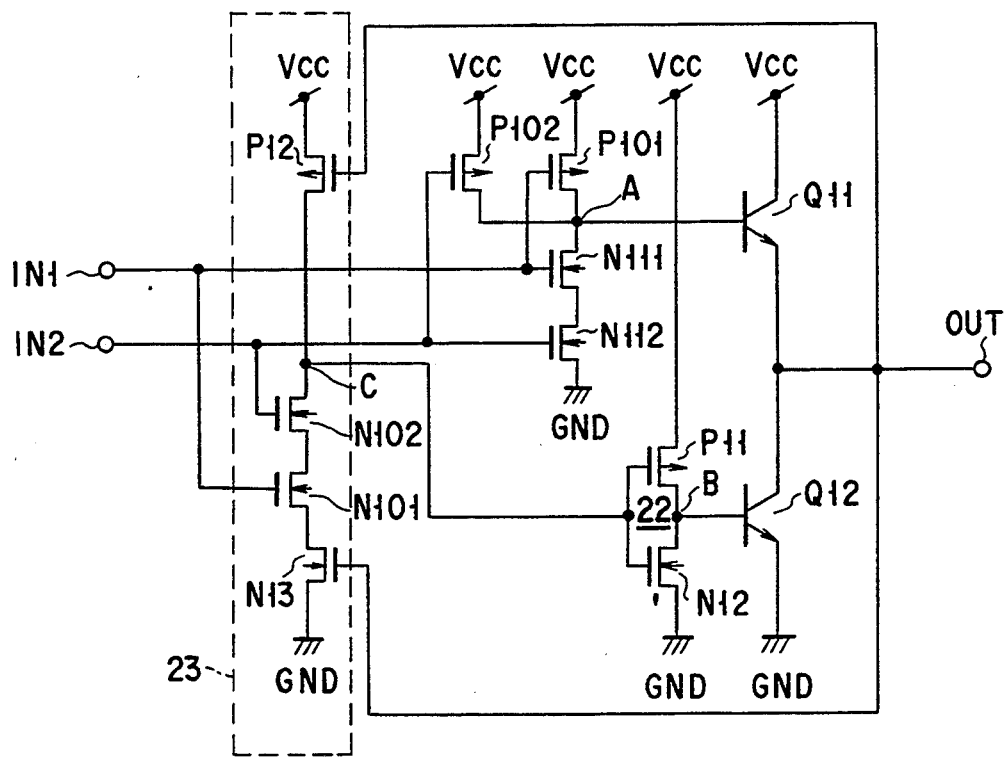
F I G.  5

BICMOS LOGIC CIRCUIT

BACKGROUND OF THE INVENTION

1. Field of the Invention

The present invention relates to a BiCMOS logic circuit comprising bipolar transistors and MOS field-effect transistors.

2. Description of the Related Art

A BiCMOS logic circuit has both the advantage inherent in a CMOS circuit, i.e., low power consumption, and that of bipolar transistors, i.e., high load-driving ability. A conventional BiCMOS disclosed in Published Unexamined Japanese Patent Application 3-34720 will be described with reference to FIG. 1.

As shown in FIG. 1, an input terminal IN is connected to the gate of a P-channel MOS FET P1 and those of N-channel MOS FETs N1 and N2. The drain of the P-channel MOS FET P1 and that of the N-channel MOS FET N2 are connected to each other, whereby the MOS FETs P1 and N2 constitute a CMOS inverter 11. The output of the inverter 11 is coupled to the base of an NPN transistor Q1. The collector and emitter of the NPN transistor Q1 are connected to the power supply $V_{CC}$ and an output terminal OUT, respectively.

The N-channel MOS FET N1 has its drain connected the output terminal OUT, and its source connected to the drain of an N-channel MOS FET N3. The N-channel MOS FET N3 has its gate connected to the output node of the inverter 11, and its source coupled to the ground power supply GND. The node where the source of the N-channel MOS FET N1 and the drain of the N-channel MOS FET N3 are coupled together is connected to the base of an NPN transistor Q2. The collector and emitter of the NPN transistor Q2 are connected to the output terminal OUT and the ground power supply GND, respectively.

The BiCMOS logic circuit of FIG. 1, which functions as an inverter gate, operates in the following way.

When the signal input to the terminal IN rises from the low (L) level to the high (H) level, the N-channel MOS FET N1, which is a driving transistor, is turned on, whereby base current flows in the NPN transistor Q2. As a result, the collector current of the transistor Q2 is multiplied by $\beta$, i.e., the emitter-ground amplification factor. The potential at the output terminal OUT is thereby pulled down to the L level. Since the P-channel MOS FET P1, which is also a driving transistor, is cut off at this time, the NPN transistor Q1, which serves as a pull-up transistor, is off.

When the signal input to the terminal IN falls from the H level to the L level, the P-channel MOS FET P1 (i.e., driving transistor) is turned on, whereas the N-channel MOS FET N2 is turned off. The NPN transistor Q1 and the N-channel MOS FET N3 are thereby turned on. Simultaneously, the N-channel MOS FET N1 (i.e., driving transistor) is turned off, whereby the NPN transistor Q2 is turned off. As a result, the potential at the output terminal OUT is pulled up to the H level.

The BiCMOS logic circuit has a problem with its pull-down side, however. The problem results from the fact that the source of the N-channel MOS FET N1 serving as a driving transistor is connected to the base of the NPN transistor Q2 which functions as a pull-down element. To be more specific, when the NPN transistor Q2 perform a pull-down operation, its base potential, i.e., the source potential of the N-channel MOS FET N1, shifts from the ground potential by the base-emitter voltage ($V_{BE}$). The gate-source voltage and drain-source voltage of the N-channel MOS FET N1 inevitably decrease by $V_{BE}$ of the NPN transistor Q2. Consequently, the N-channel MOS FET N1 has its driving ability reduced considerably. The drain current of the N-channel MOS FET N1, i.e., the base current of the NPN transistor Q2, can no longer assume a sufficiently great value, lengthening the delay time of pull-down operation of the NPN transistor Q2. Hence, the BiCMOS logic circuit of FIG. 1 cannot operate correctly, particularly when its power-supply voltage is relatively low.

As has been described, the conventional BiCMOS logic circuit (FIG. 1) is of such a structure that the MOS FET for driving the pull-down bipolar transistor inevitably has an insufficient driving ability. The delay time in the pull-down operation of the bipolar transistor is inevitably long, and the BiCMOS logic circuit can hardly operate correctly at a low power supply voltage.

SUMMARY OF THE INVENTION

The object of the present invention is to provide a BiCMOS logic circuit wherein the bipolar transistors can be driven completely with even a low power supply voltage to perform pull-down operation at high speed.

The object can be achieved by a BiCMOS logic circuit which comprises:

input terminal means for inputting an input signal;

output terminal means for outputting an output signal;

a first bipolar transistor having a main current path connected between a first potential and the output terminal means, for performing pull-up operation.

a second bipolar transistor having a main current path connected between the output terminal means and a second potential, for performing pull-down operation;

a first CMOS circuit for controlling a base cur rent of the first bipolar transistor in accordance with the level of the input signal;

a second CMOS circuit for controlling a base potential of the second bipolar transistor in accordance with a control signal; and control circuit means for generating the control signal from the level of the input signal and the level of the output signal, said control signal controlling the second CMOS circuit such that the second bipolar transistor is prevented from operating at a deep saturation region.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2 is a circuit diagram showing a BiCMOS logic circuit according to an embodiment of the present invention;

FIGS. 3A and 3B are waveform diagrams for explaining how the components of the circuit shown in FIG. 2 operate;

FIG. 4 is a table showing the operating speed of the circuit shown in FIG. 2, and also those of a conventional CMOS circuit and a conventional BiCMOS logic circuit, for comparison; and FIG. 5 is a circuit diagram of a logic gate circuit incorporating the embodiment of the present invention.

DETAILED DESCRIPTION OF THE PREFERRED EMBODIMENTS

Figure 1:
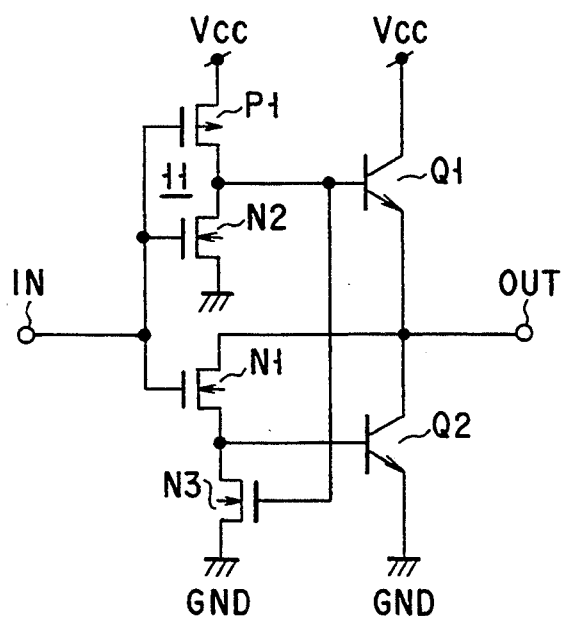
FIG. 1 is a circuit diagram showing a conventional BiCMOS logic circuit.

The present invention will be described in detail, with reference to an embodiment.

FIG. 2 shows a BiCMOS inverter circuit which is an embodiment of the present invention. As shown in FIG. 2, an input terminal is connected to the gate of a P-channel MOS FET P10 and also to those of N-channel MOS FETs N10 and N11. The drains of the MOS FETs P10 and N11 are connected to each other. The MOS FETs P10 and N11 constitute a CMOS inverter 21 which is coupled between the power supply $V_{CC}$ and the ground power supply GND. The output node A of the CMOS inverter 21 is connected to the base of an NPN transistor Q11 which functions as a pull-up transistor. The NPN transistor Q11 has its collector coupled to the power supply $V_{CC}$, and its emitter connected to an output terminal OUT. The drain (node C) of the N-channel MOS FET N10 is connected to the gate of a P-channel MOS FET P11 and also to the gate of an N-channel MOS FET N12. The drains of the MOS FETs P11 and N12 are connected to each other. The P-channel MOS FET P11 and the N-channel MOS FET N12 form a CMOS inverter 22 coupled between the power supply $V_{CC}$ and the ground power supply GND. The output node B of the CMOS inverter 22 is connected to the base of an NPN transistor Q12 which serves as a pull-down transistor. The NPN transistor Q12 has its collector connected to the output terminal OUT, and its emitter connected to the ground power supply GND. The output terminal OUT is connected to the gate of a P-channel MOS FET P12 and that of an N-channel MOS FET N13. The P-channel MOS FET P12 has its source coupled to the power supply $V_{CC}$, and its drain connected to the node C. The N-channel MOS FET N13 has its source connected to the ground power supply GND, and its drain connected to the source of the N-channel MOS FET N10. The MOS FETs N10, P12, and N13 constitute a circuit 23 for controlling the CMOS inverter 22.

In the BiCMOS inverter circuit of FIG. 2, the NPN transistor Q12 at the pull-down side is controlled by the CMOS inverter 22. Hence, the NPN transistor Q12 is driven by the P-channel MOS FET P11. Since the transistor P11 has its source connected directly to the power supply $V_{CC}$, its source potential will not shift at all. The gate-source voltage of the MOS FET P11 can therefore be high enough to drive the NPN transistor Q12 completely. As a result of this, the NPN transistor Q12 can perform pull-down operation at high speed.

Should the NPN transistor Q12 be on when the potential at the output terminal OUT falls completely to the L level, the base current would continuously flow in the NPN transistor Q12, inevitably increasing DC power consumption, and the NPN transistor Q12 would enter a deep saturation region. If this happened, the transistor Q12 should be turned off with an increased delay. It is to prevent such a turn-on delay increase that the BiCMOS inverter circuit has the control circuit 23 which receives the feedback signal from the output terminal OUT and controls the gate potential of the P-channel MOS FET P11 for driving the NPN transistor Q12.

The operation of the BiCMOS inverter circuit shown in FIG. 2 will be explained with reference to the waveform diagrams of FIGS. 3A and 3B. FIG. 3A explains how a pull-up operation is achieved, and FIG. 3B explains how a pull-down operation is performed. More precisely, FIGS. 3A and 3B show how the voltages at the nodes A, B and C, and how the voltages at the terminals IN and OUT vary with time during the pull-up and pull-down operations.

First it will be described how the circuit operates when the output (i.e., the potential at the terminal OUT) falls from the H level to the L level. In the initial state where the input (i.e., the potential at the input terminal IN) and the output are at the L level and the H level, respectively, and the MOS FETs P10 and N13 are on, whereas the MOS FETs N11 and P12 are off. Since the node C is at the H level in the initial state, as will be described later, the node B is at the L level, and the NPN transistor Q12 remains off.

When the signal input to the terminal IN rises from the L level to the H level, the N-channel MOS FET N10 is turned on, pulling down the potential at the node C to the L level and turning the P-channel MOS FET P11 on. A base current is supplied via the P-channel MOS FET P11 to the NPN transistor Q12, which is turned on. The output (OUT) is pulled down from the H level until it reaches the L level.

When the output falls to the L level, the N-channel MOS FET N13 is turned off, and the P-channel MOS FET P12 is turned on. The potential at the node C rises back to the H level. Hence, the P-channel MOS FET P11 is turned off, terminating the supply of the base current to the NPN transistor Q12. The NPN transistor Q12 is temporarily in the saturation region. Nonetheless, the N-channel MOS FET N12 is immediately turned on, lowering the base potential of the NPN transistor Q12 to the ground potential GND. The NPN transistor Q12 therefore operates a cutoff region before operating at a deep saturation region. In other words, the control circuit 23 controls the P-channel MOS FET P11 and the N-channel MOS FET N12, preventing the NPN transistor Q12 from operating at a deep saturation region.

Once a transistor has operated a deep saturation region, it will take much time to turn off the transistor next time. This would increase a delay. In the BiCMOS inverter circuit of FIG. 2, the control circuit 23 prevents the NPN transistor Q12 from operating at a deep saturation region. Due to the use of the control circuit 23, no base current is wasted. The output signal can be stabilized merely by setting an appropriate low threshold voltage for the P-channel MOS FET P12 and the N-channel MOS FETs N10 and N13.

As can be understood from FIG. 3B, the node C is at the L level for a short time only when the N-channel MOS FETs N10 and N13 are simultaneously on, or for a short period during the pull-down operation. The node C is at the H level in the initial phase of the pull-down operation, in order to remain at the H level throughout the pull-up operation as shown in FIG. 3A.

The pull-up operation is accomplished in the same manner as in the conventional BiCMOS logic circuit shown in FIG. 1.

The NPN transistor Q12 at the pull-down side is driven by the P-channel MOS FET P11 whose source potential does not shift at all. Therefore, the NPN transistor Q12 can acquire a sufficient base current.

The output is fed back, controlling the gate of the P-channel MOS FET P11 provided for driving the NPN transistor Q12. Hence, the transistor Q12 is saturated, but only for a short time immediately after the output falls to the L level. The NPN transistor Q12 can therefore perform a pull-down operation at high speed even at a low power supply voltage. Further, since the output level once falls to the saturation voltage of the NPN transistor Q12, it can approach a value close to 0 V. The BiCMOS inverter circuit can therefore supply the next-stage gate circuit with a L-level signal which has a voltage value of almost 0 V.

FIG. 4 is a table showing the operating speed of the BiCMOS inverter circuit shown in FIG. 2, in comparison with the operating speeds of a conventional CMOS inverter and a conventional BiCMOS inverter—all speeds simulated by means of SPICE. In FIG. 4, $T_{PLH}$ is a rising time, $T_{PHL}$ is a falling time, and $T_{pd}$ is the mean value of $T_{PLH}$ and $T_{PHL}$ which is generally known as "delay time." The greater the load capacitance used in each circuit, the greater the difference in operating speed. As is evident from FIG. 4, the circuit of FIG. 3 according to the invention excels in the operating speed at a low power supply voltage.

The circuit of FIG. 2, which is an inverter, can be easily modified into a gate circuit of another type. For example, it can be changed to a two-input NAND gate, merely by re-designing the CMOS circuits in the stage preceding the bipolar transistors. Such a two-input NAND gate will be described with reference to FIG. 5, in which the elements identical to those shown in FIG. 2 are designated at the same symbols.

AS shown in FIG. 5, the first input terminal IN1 is connected to the gate of an N-channel MOS FET N101, the gate of a P-channel MOS FET P101, and the gate of an N-channel MOS FET P111. The second input terminal IN2 is connected to the gate of an N-channel MOS FET N102, the gate of a P-channel MOS FET P102, and the gate of an N-channel MOS FET N112. The MOS FETs N101 and N102 are incorporated in a control circuit 23, along with a P-channel MOS FET P12 and an N-channel MOS FET N13. The source of the MOS FET N101 and the drain of the MOS FET N102 are connected to each other, where by theses MOS FETs form a series circuit. This series circuit is coupled between a node C and the drain of the N-channel MOS FET N13. The source of the MOS FET N111 and the drain of the MOS FET N112 are connected, whereby the FETS N111 and N112 constitute a series circuit which is coupled between a node A and the ground power supply GND. The MOS FETs P101 and P102 have their source-drain paths connected in parallel between the node A and the power supply $V_C$. Only when the potentials at both input terminals IN1 and IN2 are at the H level, the potential at the output terminal OUT is at the L level.

The CMOS inverter 22 incorporated in the two-input NAND gate and used to control the NPN transistor Q12 provided at the pull-down side is identical to the CMOS inverter 22 used in the BiCMOS inverter circuit of FIG. 2. Only the control circuit 23 arranged in the stage preceding the CMOS inverter 22 is modified, despite that two input terminals (i.e., fan-in elements) are used, not a single input terminal as in the circuit of FIG. 2. Thus, no additional load is exerted on the CMOS inverter 22 which applies $V_{CC}$ or GND voltage to the base of the NPN transistor Q12. In spite of the two input terminals provided, the NPN transistor Q12 is prevented from operating at a deep saturation region since the control circuit 23 controls the P-channel MOS FET P11 and the N-channel MOS FET N12.

As has been described, a sufficient base current is supplied via the CMOS circuit 22 to the pull-down NPN transistor Q12. After the output has been pulled down, the control circuit 23 which receives the output prevents a base current from flowing continuously in the NPN transistor Q12, thereby preventing saturation of the NPN transistor Q12. Hence, in the BiCMOS logic circuit of this invention, the bipolar transistor can be driven completely, achieving a pull-down operation at high speed and outputting a signal which is at a level close to 0 V.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A BiCMOS logic circuit which comprises:
   input terminal means for inputting an input signal;
   output terminal means for outputting an output signal;
   a first bipolar transistor having a main current path connected between a first potential and said output terminal means, for performing pull-up operation;
   a second bipolar transistor having a main current path connected between said output terminal means and a second potential, for performing pull-down operation;
   a first CMOS circuit for controlling a base current of said first bipolar transistor in accordance with the level of the input signal;
   a second CMOS circuit for controlling a base potential of said second bipolar transistor in accordance with a control signal; and
   control circuit means for generating the control signal from the level of the input signal and the level of the output signal, said control signal controlling said second CMOS circuit such that said second bipolar transistor is prevented from operating at a deep saturation region.

2. The BiCMOS logic circuit according to claim 1, wherein said first and second bipolar transistors are of the same polarity type which is NPN type.

3. The BiCMOS logic circuit according to claim 1, wherein said second CMOS circuit applies the first potential to the base of second bipolar transistor under the control of said control circuit means.

4. The BiCMOS logic circuit according to claim 1, wherein said control circuit means operates to set said control signal at said second potential, when both the level of the input signal and the level of the output signal are at said first potential.

5. A BiCMOS logic circuit which comprises:
   input terminal means for inputting an input signal;

output terminal means for outputting an output signal;

a first CMOS circuit connected between a first potential and a second potential, having an input node and an output node, and controlled by the input signal supplied to said input node;

a first NPN transistor connected to the output node of said first CMOS circuit, having a collector-emitter path connected between the first potential and said output terminal means, and designed to pull up a potential at said output terminal means;

a second CMOS circuit connected between the first potential and the second potential and having an input node and an output node;

a second NPN transistor having a base connected to the output node of said second CMOS circuit to be supplied with the first potential, and having a collector-emitter path connected between the second potential and said output terminal means, and designed to pull down the potential at said output terminal means;

control circuit for setting a voltage applied to the input node of said second CMOS circuit at a value in accordance with the the level of the input signal and the level of the output signal, and for controlling said second CMOS circuit such that said second NPN transistor is prevented from operating at a deep saturation region when the potential at said output terminal means is pulled down.

6. The BiCMOS logic circuit according to claim 5, wherein said second CMOS circuit further comprises a P-channel MOS FET connected between the first potential and the base of said second NPN transistor, for transferring the first potential to the base of the second NPN transistor.

7. The BiCMOS logic circuit according to claim 5, wherein said control circuit is located in a stage preceding said second CMOS circuit, for performing feedback control on said second CMOS circuit.

8. The BiCMOS logic circuit according to claim 5, wherein said control circuit operates to set said control signal at said second potential, when both the level of the input signal and the level of the output signal are at said first potential.

* * * * *

UNITED STATES PATENT AND TRADEMARK OFFICE
CERTIFICATE OF CORRECTION

PATENT NO. : 5,365,124
DATED : November 15, 1994
INVENTOR(S) : Katsuhiro SETA et al It is certified that error appears in the above-indentified patent and that said Letters Patent is hereby corrected as shown below:

Claim 5, Column 7, Line 15, delete ","

Claim 5, Column 8, Line 1, delete "the" (second occurrence).

Signed and Sealed this

Thirteenth Day of June, 1995

Attest:

BRUCE LEHMAN

Attesting Officer     Commissioner of Patents and Trademarks